United States Patent [19]
Ng

[11] Patent Number: 4,779,282
[45] Date of Patent: Oct. 18, 1988

[54] LOW LEAKAGE CURRENT GAINASP/INP BURIED HETEROSTRUCTURE LASER AND METHOD OF FABRICATION

[75] Inventor: Willie W. Ng, Thousand Oaks, Calif.

[73] Assignee: Hughes Aircraft Company, Los Angeles, Calif.

[21] Appl. No.: 104,471

[22] Filed: Oct. 5, 1987

[51] Int. Cl.$^4$ .............................................. H01S 3/19
[52] U.S. Cl. ........................................ 372/46; 372/45
[58] Field of Search ................ 372/46, 45, 44; 357/17

[56] References Cited

U.S. PATENT DOCUMENTS

| | | | |
|---|---|---|---|
| 4,425,650 | 1/1984 | Mito et al. | 372/46 |
| 4,426,700 | 1/1984 | Hirao et al. | 372/46 |

OTHER PUBLICATIONS

Noguchi et al., "Low Threshold Current CW Operation of InP/GaInAs Buried Heterostructure Laser", Jap. Journal of App. Phy., vol. 19, No. 12, Dec. 1980, pp. L759-L762.
K. Y. Lau, et al., "11-GHz Direct Modulation Bandwidth GaAlAs Window Laser on Semi-Insulating Substrate Operating at Room Temperature", Applied Physics Letters, vol. 45, Aug. 1984, pp. 316-318.
Willie Ng, et al., "Low-Threshold 1.3-$\mu$m GaInAsP-/InP Buried Heterostructure Lasers by Liquid Phase Epitaxy and Metalorganic Chemical Vapor Deposition", Appl. Phys. Lett., 39, Aug. 1981, pp. 188-189.
C. B. Shu, et al., "15 GHz Direct Modulation Bandwidth of Vapor-Phase Regrown 1.3 $\mu$m InGaAsP Buried-Heterostructure Lasers Under CW Operation at Room Temperature", Electronics Letters, vol. 21, No. 13, Jun. 1985, pp. 557-578.
J. E. Bowers, et al., "High-Frequency Constricted Mesa Lasers", Appl. Phys. Letters, vol. 47, Jul. 1985, pp. 78-90.
Y. Nakano et al., "High Power Output InGaAsP/InP Buried Heterostructure Lasers", Electronics Letters, vol. 17, No. 21, Oct. 1981, pp. 782-783.
Y. Nakano et al., "Abnormality at the Interface of p-type InP Grown by LPE", Japan. Journal of Applied Physics, vol. 20, No. 8, Aug. 1981, pp. L619-L622.
M. Sugimoto et al., "InGaAsP/InP Current Confinement Mesa Substrate Buried Heterostructure Laser Diode Fabricated by One-Step Liquid Phase Epitaxy", IEEE J. of Lightwave Technology, vol. LT-2, No. 4, Aug. 1984, pp. 496-503.
W. Ng et al., "An Analytic Model for the Modulation Response of Buried Heterostructure Lasers", IEEE J. Quantum Electronics, vol. QE-20, No. 9, Sep. 1984, pp. 1008-1015.
R. A. Logan, et al., "Liquid Phase Epitaxial Growth on (111)$_{In}$ Planes of InP", J. Applied Physics, vol. 54(9), Sep. 1983, pp. 5462-5463.

*Primary Examiner*—William L. Sikes
*Assistant Examiner*—Georgia Y. Epps
*Attorney, Agent, or Firm*—Terje Gudmestad; Paul M. Coble; A. W. Karambelas

[57] ABSTRACT

The device provided is a GaInAsP/InP laser, of the buried heterostructure type, fabricated by a two-step liquid-phase epitaxy technique. The active region is defined by a mesa etch to achieve low threshold current and a single transverse optical mode. The mesa is subsequently buried by a second step of liquid-phase epitaxy for optical and current confinement. A low bandgap heterobarrier is employed to reduce leakage current near the active region at high current biases. A contact layer is grown directly over a majority carrier confining clad layer to reduce defects in the crystal face on the side of the clad layer, and thereby further reduce leakage current.

8 Claims, 4 Drawing Sheets

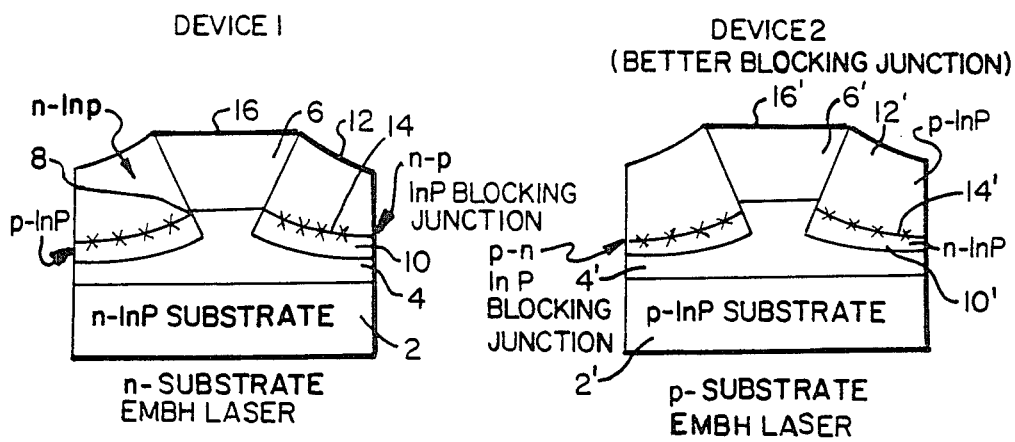
Fig.1.a.
(PRIOR ART)
Fig.1.b.
(PRIOR ART)
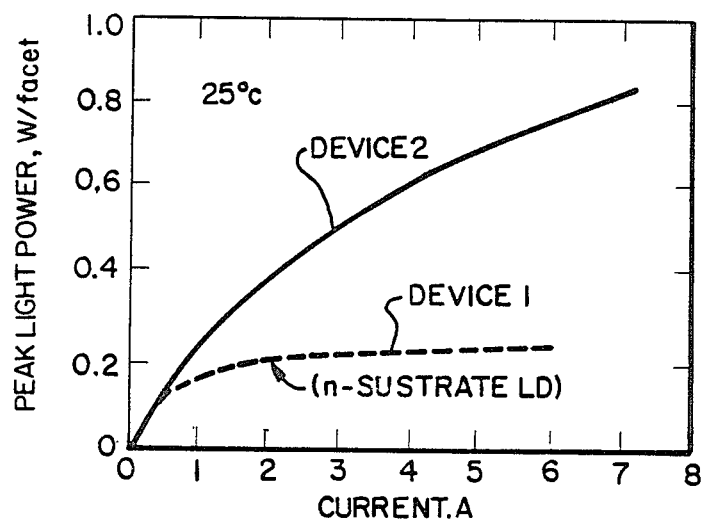
Fig.2.
(PRIOR ART)

LOW LEAKAGE CURRENT GAINASP/INP BURIED HETEROSTRUCTURE LASER AND METHOD OF FABRICATION

BACKGROUND OF THE INVENTION

1. Field of the Invention

This invention relates to semiconductor lasers, and in particular to buried heterostructure lasers.

2. Description of the Related Art

Fiber optic systems offer several advantages over coaxial links for RF transmission, such as low cost, low attenuation, light weight, immunity from electromagnetic interference, large bandwidth, and novel signal processing capabilities. The key building block for these systems is an RF fiber optic link (delay line that consists of a microwave modulated light source, an optical fiber cable, and a high-speed optical detector). Recent advances in fiber optic technology have resulted in single-mode fibers with tens of gigahertz bandwidths, and in the demonstration of high-speed (about 20 GHz bandwidth) GaInAsP/InP detectors that cover the wavelength range from 1.0 to 1.7 micrometers. Low threshold current single-mode 1.3 $\mu$m GaInAsP/InP semiconductor lasers have also been demonstrated. The laser source in the RF fiber optic link can be modulated either directly or with an external modulator. External modulators offer, at present, a slightly wider modulation bandwidth (about 19 GHz), and the possibility of being used in conjunction with laser sources that need only to be optimized for noise reduction. Direct modulation is, undoubtedly, a simpler scheme that offers a high optical throughput. Furthermore, it consumes less drive power than external modulators.

Future airborne and space-borne phased array radar systems will probably require RF fiber optic links for signal distribution, power combination, phase shifting, and beam formation. Much work is being done on the development of high-speed and low-noise semiconductor lasers, high-speed photodetectors, wideband electro-optical modulators, and wideband RF fiber optic links. Because of the possibility of transmitting microwave signals through optical fibers, much effort has been expended in extending the modulation bandwidth of semiconductor lasers to 10 GHz and beyond. There exists a need to develop a semiconductor laser with a modulation bandwidth of about 20 GHz. The availability of such a laser would enable an extremely low noise floor to be attained for RF fiber optic links that operate in the X band (8-12 GHz) and below.

The fabrication of high-speed semiconductor lasers was originally concentrated on GaAlAs/GaAs lasers that emit at 0.85 $\mu$m. The well-developed material technology of GaAlAs/GaAs enabled devices of sophisticated design to be fabricated. A direct modulation bandwidth of 12 GHz was first reported for a window-type buried heterostructure (BH) GaAlAs/GaAs laser fabricated on semi-insulating substrates. This is described in the paper by K.Y. Lau et al. in *Applied Physics Letters*, Vol. 45, pages 316-318, August 1984. In this work the device structure made use of a GaAlAs window of a larger bandgap than the active layer to increase the output power limit before catastrophic mirror damage occurred. The semi-insulating substrate also served to reduce chip capacitance. However, the promise of larger repeater spacing at 1.3 $\mu$m for telecommunication links (of 10 km or longer) stimulated intense material research on the quaternary material GaInAsP, which can be grown lattice-matched to InP substrates and operated in the wavelength range between 0.95 and 1.7 $\mu$m. This led to the demonstration of quaternary single-mode lasers that possess threshold currents comparable to their GaAs counterparts. Furthermore, the stability of their cleaved facets to high photon densities led to the conjecture that quaternary lasers would possess intrinsic modulation bandwidths that would be larger than those of GaAlAs/GaAs lasers.

That conjecture was realized with the development of a class of buried heterostructure lasers widely referred to as constricted mesa BH lasers. The fabrication of these lasers employs a hybrid combination of liquid-phase epitaxy (LPE) for the growth of the double heterostructure, and regrowth procedures that make use of the techniques of mass transport or vapor phase epitaxy to deposit burying layers of a small (about 1 $\mu$m) lateral width for optical confinement. The latter technique was first demonstrated with metal-organic chemical vapor deposition (MOCVD) by Ng et al., as reported in the paper published in *Applied Physics Letters*, Vol. 39, pages 188-189, August 1981. Two high-speed constricted mesa BH lasers are reported in the following papers: C.B. Su et al., *Elect. Lett.*, Vol. 21, pages 577-578, June 1985; and J. E. Bowers et al., *Applied Physics Letters*, Vol. 47, pages 78-90, July 1985.

The modulation response of a semiconductor laser can be considered as the superposition of an intrinsic modulation response that is governed by photon-carrier interactions in the diode cavity, and a gradual roll-off attributable to chip and packaging parasitics. The upper limit of the intrinsic modulation response is set by the resonance frequency ($f_o$), at which a pronounced resonance peak is theoretically predicted and observed. Hence, a primary concern in the design of high-frequency semiconductor lasers is to maximize $f_o$, the square of which is directly proportional to the power output and differential gain of the device, and inversely proportional to the diode cavity volume. Any improvements gained in the output power of the device without expanding its optical mode volume will lead to a corresponding increase of the maximum resonance frequency. In practice, a parasitic "roll-off" often limits the observed modulation response to a 3-dB bandwidth given approximately by the inverse of a time constant determined, in turn, by the chip capacitance ($C_j$) and series resistance ($R_s$).

The modulation of related-art 1.3 lm lasers indicates that the intrinsic modulation bandwidth of these devices typically saturates at a "maximum" resonance frequency of about 12-15 GHz. This is due to the saturation of their output power, or equivalently, a decrease of their differential quantum efficiency at high current biases. The loss of differential quantum efficiency in these devices can be attributed to a combination of junction heating and undesirable leakage current increases at high bias currents. This suggests that a further increase of the "maximum" resonance frequency or modulation bandwidth could only be achieved by designing a new device structure that would utilize the injected current more efficiently; i.e., improve the differential quantum efficiency and hence obtain more output power for the same bias current. Such a device would have the best potential for advancing beyond the current state of the art, and meet the goal of attaining a 20 GHz modulation bandwidth at room temperature.

An important aspect of achieving a high differential quantum efficiency, and therefore optical power, in stripe geometry lasers is to channel the injected current as efficiently as possible into the active region. In buried heterostructures this is accomplished by preventing the bias current from flowing across the burying layers that provide transverse mode confinement. FIGS. 1(a) and 1(b) show two previously reported 1.3-um lasers. The InP structure of FIG. 1(a) is formed on an n-type substrate 2. A p-type mesa consisting of a buffer layer 4 and clad layer 6 over the central portion of the buffer layer is formed on the substrate, with an active region 8 between the buffer and clad layer. The clad layer 6 provides carrier confinement to the mesa, and is doped to confine light within the active region. To further confine current flow to the mesa, a p-type layer 10 and n-type layer 12 are grown in succession over the lower portion and adjacent the sides of the mesa, forming an n-p blocking junction. A dielectric layer 16 is formed over the top of clad layer 6 to confine the growth of the blocking layers 10 and 12 to the sides of the mesa, and make sure none gets on top of the mesa. The laser structure of FIG. 1(b) is similar, but the doping of the substrate 2', buffer layer 4', clad layer 6' and blocking layers 10' and 12' are reversed from their counterparts in FIG. 1(a).

The fabrication of complementary laser structures on p-InP substrates was reported by Y. Nakano et al. in a paper in *Elect. Lett.*, Vol. 17, pages 782–783, October 1981. A high-power GaInAsP/InP etched mesa buried heterostructure laser fabricated on a p-substrate was reported by Nakano et al. The difference in the output power obtained between the complementary structures FIGS. 1(a) and 1(b) is illustrated in FIG. 2. The experimental results demonstrated that a p-n blocking junction (as in a p-substrate BH laser) is superior to a n-p blocking junction (as in an n-substrate BH laser). The underlying physical mechanism responsible for the difference was explained by the presence of an abnormally high resistivity region near the surface of p-type InP. The investigation reported by Y. Nakano et al. in *Japan J. Appl. Phys.*, Vol. 20, No. 8, L619–L622, August 1981, shows that a blocking junction formed by growing a p-InP layer on top of an n-InP layer has a higher, more stable breakdown voltage than its complementary counterpart. It is, therefore, more efficient in confining current flow through the active region.

While the p-substrate device attains a higher output power, both devices suffer from a leakage current along the lateral faces of their respective clad layers that bypass the blocking junction, and can create a short to the substrate. These leakage currents have been traced to crystal face defects along the sides of the clad layers, as reported by R. A. Logan, et al. in J. Appl. Phys., Vol. 54(9), p. 5462–5463, Sept. 1983.

SUMMARY OF THE INVENTION

In view of the foregoing problems associated with the related art, it is an object of the invention to provide a new semiconductor laser device structure and method of fabricating the same that achieves a high differential quantum efficiency without trade-off of the chip capacitance.

It is another object to provide a wide-bandwidth semiconductor laser that is needed for the implementation of RF fiber optic links for microwave transmission.

Another object is to provide a semiconductor laser with a double heterostructure grown on a p-type InP substrate to improve, simultaneously, current confinement to the active region and contact resistance.

Yet another object is to provide a semiconductor laser with a heterobarrier to reduce leakage current near the active region at high current biases.

Another object is to provide a semiconductor laser with reduced capacitance over conventional GaInAsP/InP lasers to produce wider bandwidth in the modulation response.

Still another object is to provide a GaInAsP/InP semiconductor laser with more power than the related art, which results in a greater maximum resonance frequency and hence a wider modulation bandwidth.

Finally, it is an object to provide a GaInAsP/InP semiconductor laser which exhibits a smaller roll-off of the modulation response than the related art.

The device provided is a GaInAsP/InP laser, of the buried heterostructure type, fabricated by a two-step liquid-phase epitaxy. The active region is defined by a mesa etch to achieve low threshold current and a single transverse optical mode. The mesa is subsequently buried by a second step of liquid-phase epitaxy for optical and current confinement. It is distinguished from laser structures reported to date by a heterobarrier which is employed to reduce leakage current near the active region at high current biases, and a contact layer which directly contacts a current confining clad layer above the active region grown in p-InP. Since there is no compromise of lowered chip capacitance in the fabrication, the reduction of the contact resistance leads to a further enhancement of the 3-dB roll-off bandwidth. The device structure uniquely combines the superior current confinement schemes used in high-power (about 80 mW CW) GaInAsP/InP lasers, with a reduction of the time constant directly responsible for the "roll-off" in the modulation response.

These and other features and advantages of the invention will be apparent to those skilled in the art from the following detailed description of a preferred embodiment, taken together with the accompanying drawings, in which like reference numerals refer to like parts.

BRIEF DESCRIPTION OF THE DRAWINGS

FIGS. 1(a) and 1(b) are simplified sectional views of prior n-substrate and p-substrate etched mesa BH lasers, respectively;

FIG. 2 is a graph of the difference in output powers between n-substrate and p-substrate lasers of FIGS. 1(a) and 1(b);.

DESCRIPTION OF THE PREFERRED EMBODIMENT

Figure 3:
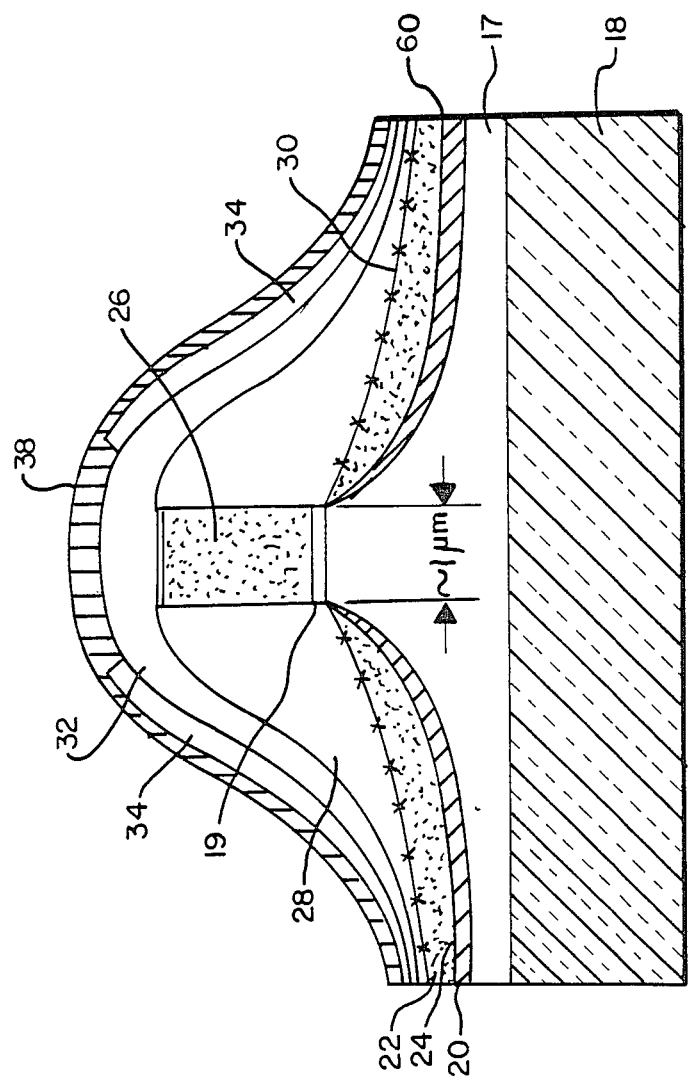
FIG. 3 is a sectional view of a laser formed in accordance with the invention.

FIG. 3 is a sectional view of the preferred embodiment of the invention. The device is basically a buried heterostructure with an improved current confinement scheme. When the active region is only 1–2 um wide, the threshold current is of the order of 15–30 mA.

In FIG. 3 the device is shown in cross-section, transverse to the direction of the emitted laser light. A p-InP buffer layer 17 overlies a p-InP substrate 18. Centered on top of the buffer layer 17 is an active region 19, a narrow layer of GaInAsP approximately 1 micron wide. The upper surface of the buffer layer 17 curves downward and away from the sides of the active region 19. An n-GaInAsP quaternary layer 20 overlies the curved upper surface of the buffer layer 17. Overlying the n-GaInAsP layer 20 is an n-InP blocking layer 22, which forms a heterobarrier 24 at its interface with quaternary layer 20. The n-GaInAsP layer 20 has a lower bandgap than n-InP layer 22, a feature that is discussed in more detail below and is important in reducing the device's leakage current.

Above the active region 19 is a rectangular-shaped clad layer 26 of n-InP. A clad layer of this type is a known way of helping to confine the majority carriers and light to the active region. Together with the buffer layer 17 and active region 19 it forms an overall mesa structure. A high-resistivity p-InP blocking layer 28 occupies the region between the sides of the clad layer 26 and the upper surface of the n-InP layer 22. A blocking junction 30 is formed between the p-InP and n-InP blocking layers 28 and 22.

An n-InP contact layer 32 covers the high-resistivity p-InP blocking layer 28 and the upper portion of clad layer 26. As opposed to prior laser structures in which a dielectric was placed over the clad layer 26 to confine the growth of the blocking layers to the sides of the mesa structure, no such dielectric layer is employed in the invention. The use of a dielectric layer prevented the growth of a doped InP contact layer over the clad layer in the prior devices. This has been found to result in defects in the crystal face on the side of the clad layer which creates leakage paths that bypass the blocking layers, and short the device to its substrate. Current fabrication techniques, however, have been found to be precise enough to allow the blocking layers to be adequately confined to the sides of the mesa without significant overlap onto its top. In accordance with the invention the elimination of the former dielectric layer has been found to significantly reduce the crystal face defects, and thus the leakage paths, along the sides of the clad layer.

On the contact layer 32 to either side of, and slightly overlapping the top of the clad layer 26 is a thick (400 nm) insulating layer 34 of $SiO_2$. Insulating layer 34 is open above the top of clad layer 26. A stripe contact 38 is formed over the insulating layer 34 and exposed portion of the contact layer 32. The contact 38 comprises an ohmic contact material such as Au.

Figure 4:
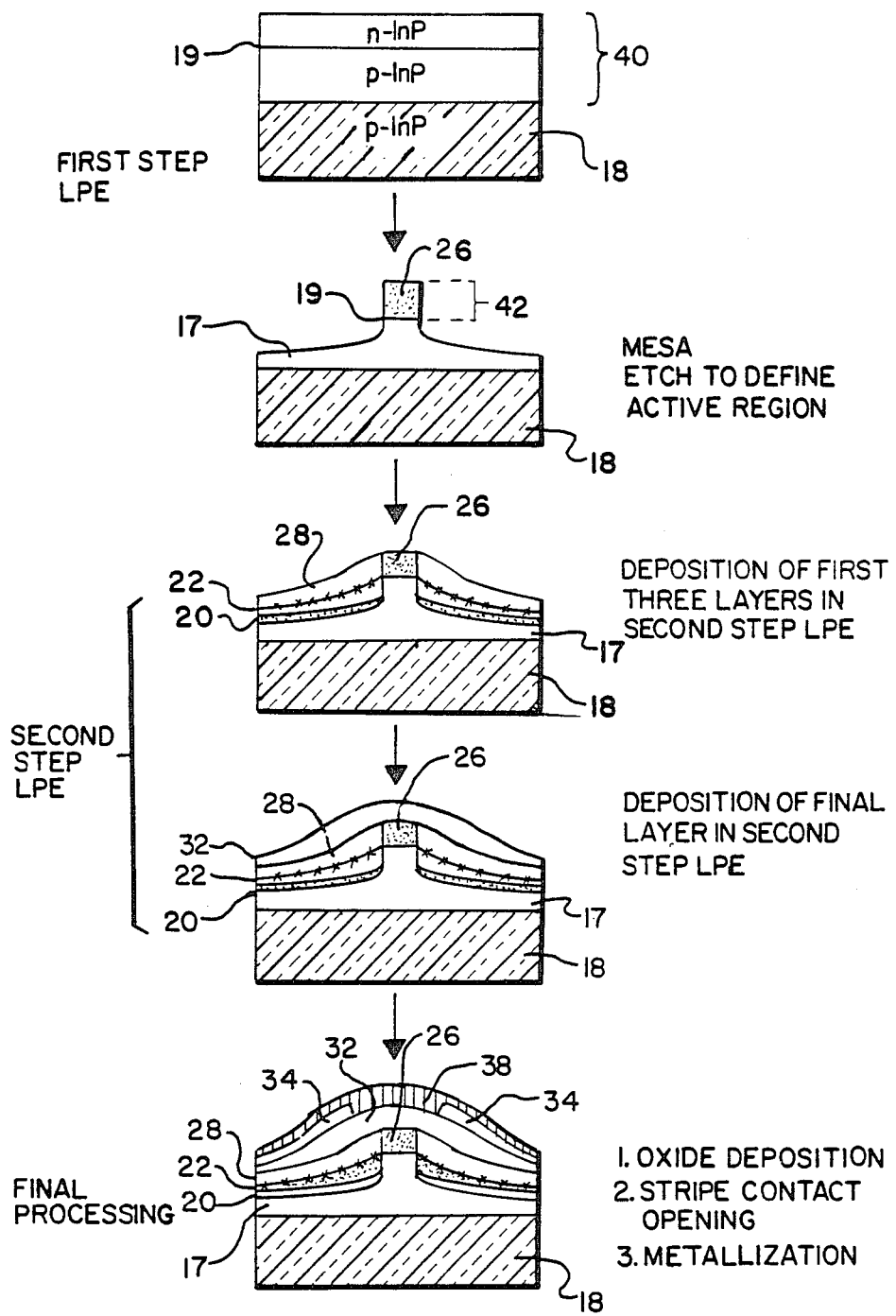
FIG. 4 is a series of sectional views showing the device fabrication process.

The fabrication sequence for the device is illustrated in FIG. 4. The device is fabricated by a two-step liquid phase epitaxy (LPE) technique. In the first step, a double heterostructure 40 of GaInAsP/InP is grown on the p-InP substrate 18. A mesa 42 is then etched down to the p-InP buffer layer 17 to define the active region 19 surmounted by clad layer 26. Using a second step of liquid phase epitaxy, the n-GaInAsP layer 20, n-InP blocking layer 22, and p-InP bocking layer 28, followed by the final n-InP contact layer 32, are deposited on the mesa for optical and current confinement. During the second step of liquid phase epitaxy, the first blocking layer 22 of n-InP and the second blocking layer 28 of p-InP are "pinched off" at the top of the narrow mesa, causing P atoms to diffuse toward the sides of the mesa where the growth rate is fastest. As the curvature of the mesa is reduced by the deposition of the first two layers of InP, the growth of the contact layer 32 of n-InP proceeds on top of the mesa.

The GaInAsP/InP lasers are grown in a graphite boat of the multi-well, sliding type. The furnaces are mounted on rails which enable rapid heating and cooling of the graphite boats during the growth cycle. This is useful for the fabrication of device structures that require a two-step growth process.

Figure 5:
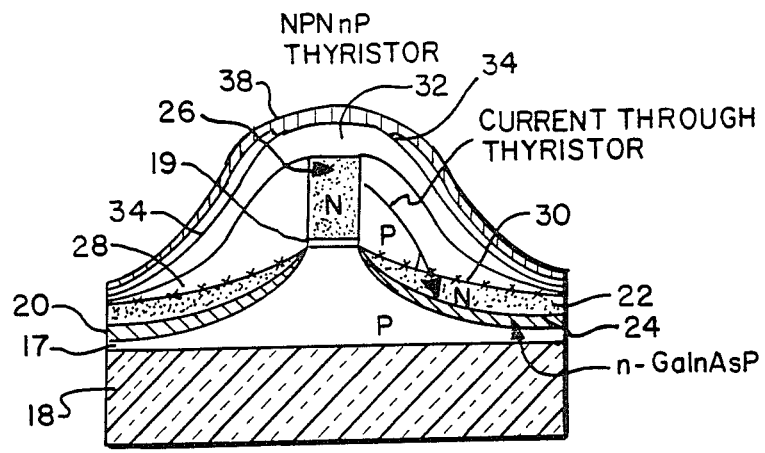
FIG. 5 is a sectional view of the device of FIG. 3 showing the current path through a parasitic NPNnP thyristor, whose breakdown voltage limits the power output.
Figure 6:
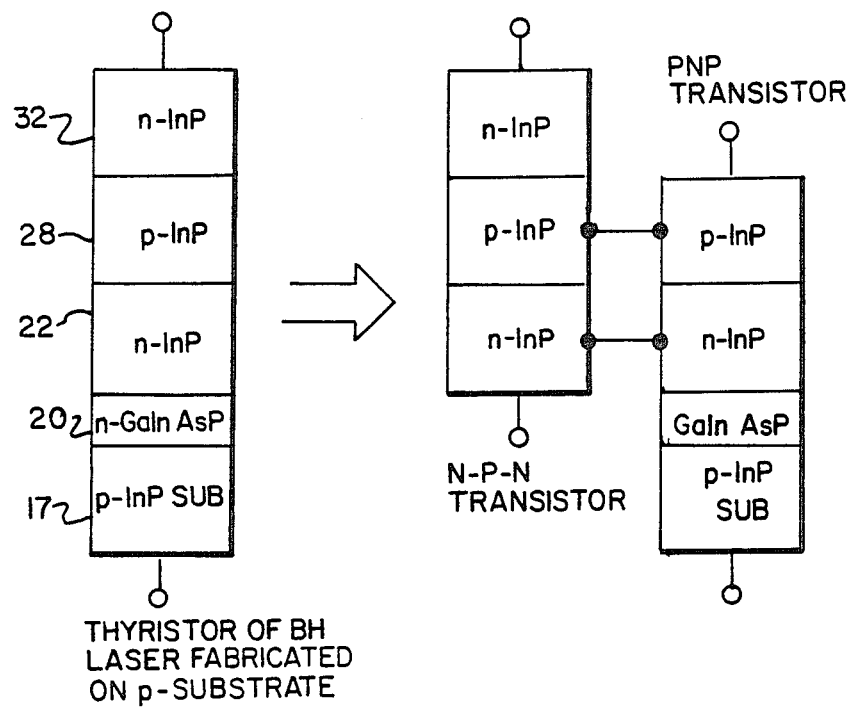
FIG. 6 is a sectional view illustrating the breakdown of the FIG. 5 thyristor into a pair of coupled (NPN and PNP) transistors.

The output power of GaInAsP/InP buried heterostructure lasers is typically limited by the breakdown of their current blocking junctions. In device structures such as the present invention that make use of a blocking junction, a parasitic NPNP thyristor (FIG. 5) can be triggered into breakdown by a high bias voltage. The introduction of the small-bandgap layer 20 into the thyristor has been found to significantly increase the breakdown voltage. The physical mechanism of the known parasitic is explained by Sugimot et al. in an article in *IEEE J. Lightwave Technol.*, Vol. LT-2, pages 496–503, August 1984. In that paper the prior PNPN thyristor was analyzed as consisting of coupled PNP and NPN transistors. In short, the thyristor switches to its conducting state when a critical increase in the gain of the PNP and NPN transistors is obtained. The breakdown voltage of the thyristor is increased if the gain of either transistor is spoiled. This is accomplished in the present invention by placing a heterobarrier in the PNP transistor to create an NPNnP blocking structure. The equivalent breakdown of the NPNnP parasitic thyristor into NPN and PNnP devices is illustrated in FIG. 6.

The saturation of the output power for the majority of GaInAsP/InP lasers reported to date is not due entirely to the increase of leakage current at high bias voltages. During CW operation the diode junction can be as much as 10° C. above its heat-sink temperature because of ohmic heating. The temperature difference is more significant for GaInAsP/InP lasers than GaAlAs/GaAs lasers because of their lower value of heat-sink temperature $T_o$ ($T_o$ is about 60° C. for quaternary lasers). Ohmic heating of the chip can be reduced considerably through improvements in the contact resistance of the chip.

It is well known that a main contribution to the series resistance of conventional n-substrate lasers is the stripe contact resistance on the p-epitaxial side. By reversing the polarity from n to p, the stripe contact of the invention is fabricated on the n-epitaxial side, for which ohmic contacts are readily achieved. The p-contacts of a much higher contact resistance are now fabricated over a broad area on the substrate side. Low series resistance is obtained consistently with etched mesa BH (FIG. 1(b)) type p-substrate lasers.

The lowered series resistance helps to increase the modulation bandwidth in two ways. First, a higher output power is expected with reduced thermal heating of the heterojunction. Second, for the same chip capacitance the 3-dB roll-off frequency ($F = 1/(R_s C_j)$) is expected to be enhanced.

The cavity volume can be decreased without any sacrifice in the ease of processing by shortening the laser cavity length. A cavity length of about 120–140 microns can be cleaved with good control if the processed wafer has been lapped to a reasonable thickness of about 4 mils. Second, the differential gain can be enhanced by increasing the doping of the active layer. Alternatively, the enhancement of the resonance frequency can be attributed to a shortening of the carrier lifetime with an increase in the doping of the active layer. However, this will simultaneously increase the threshold current and decrease the internal quantum efficiency. Lasers with a carrier lifetime of about 1.0–1.5 ns were found to possess good internal quantum efficiency and threshold current density, as reported by the inventor W. Ng and E.A. Sovero in *IEEE J. Quan. Elect.*, Vol. QE-20, pages 1008–1015, September 1984.

Using a cavity length of about 120 microns, a value of about 0.9 picoseconds for the photon lifetime was obtained. Assuming a carrier lifetime of about 1.0 ns, a resonance frequency of about 20 GHz should be obtained at a bias current of about 100 mA if the threshold current is approximately 20 mA.

The present invention has been described in detail with reference to a particular preferred embodiment. However, persons skilled in the art will appreciate that various modifications may be made without departing from the spirit and scope of the invention. Accordingly, it is intended that the invention be limited only in terms of the appended claims.

I claim:

1. A buried heterostructure semiconductor laser, comprising:
    a p-type doped semiconductor substrate,
    a semiconductor p-type buffer layer, active region and n-type clad layer formed in succession over the substrate and collectively forming a mesa shape,
    first and second blocking layers of oppositely doped semiconductor material of n and p type conductivity, respectively disposed in succession over the buffer layer lateral to the active region and forming a blocking p-n junction to confine majority carrier flow to the active region,
    a layer of n-type doped semiconductor material having a lower bandgap than the first blocking layer disposed between said buffer layer and said first blocking layer,
    an electrically conductive n-type doped semiconductor contact layer overlying and in direct contact with said second blocking layer and said clad layer,
    an insulating layer overlying said contact layer above said second blocking layer and generally lateral to said clad layer, and
    an electrical contact overlying said insulating and contact layers.

2. The semiconductor laser of claim 1, wherein said substrate, buffer layer and second blocking layer comprise p-type InP, said first blocking, clad, and contact layers comprise n-type InP, and said active region and low bandgap layers are GaInAsP.

3. The semiconductor laser of claim 2, wherein said insulating layer comprises $SiO_2$ and said electrical contact comprises Au.

4. A buried heterostructure semiconductor laser, comprising:
    a p-type substrate,
    a p-type buffer layer contiguous with and overlying said substrate,
    an active semiconductor region contiguous with and overlying a central portion of said buffer layer,
    an n-type heterobarrier layer contiguous with and overlying said buffer layer and extending generally laterally from said active region,
    an n-type blocking layer contiguous with and overlying said heterobarrier layer extending generally laterally from said active region,
    an n-type clad contiguous with and overlying said active region,
    a p-type blocking layer contiguous with and overlying said n-type blocking layer extending generally laterally from said active region,
    a n-type doped semiconductor contact layer contiguous with and overlying said p-type blocking layer and said clad layer,
    an insulating layer contiguous with and overlying said contact layer generally lateral to said clad layer to expose a central portion of said contact layer, and
    an electrically conductive contact contiguous with and overlying said insulating layer and the exposed portion of said contact layer.

5. The semiconductor laser of claim 4, wherein said substrate, buffer layer and p-type blocking layer comprise p-type InP, said first blocking, clad, and contact layers comprises n-type InP, and said active region and heterobarrier layers comprise substantially GaInAsP.

6. The semiconductor laser of claim 5, wherein said active region has a width of about 1 micron.

7. The semiconductor laser of claim 4, wherein said insulating layer comprises $SiO_2$ and has a thickness of about 400 nanometers.

8. The semiconductor laser of claim 4, wherein said electrical contact comprises Au.

* * * * *